(12) United States Patent
Tran (10) Patent No.: US 8,068,376 B1
(45) Date of Patent: Nov. 29, 2011

(54) LOW LEAKAGE HIGH STABILITY MEMORY ARRAY SYSTEM

(76) Inventor: Hiep Van Tran, Dallas, TX (US)

(*) Notice: Subject to any disclaimer, the term of this patent is extended or adjusted under 35 U.S.C. 154(b) by 638 days.

(21) Appl. No.: 11/825,721

(22) Filed: Jul. 9, 2007

Related U.S. Application Data (60) Provisional application No. 60/821,135, filed on Aug. 2, 2006.

(51) Int. Cl.
*G11C 5/14* (2006.01)
(52) U.S. Cl. ......... 365/228; 365/222; 365/226; 365/229
(58) Field of Classification Search .................. 365/228, 365/222, 185.24, 185.25, 226, 229
See application file for complete search history.

(56) References Cited

U.S. PATENT DOCUMENTS

| | | | | |
|---|---|---|---|---|
| 6,714,473 | B1* | 3/2004 | Fiscus | 365/189.07 |
| 6,967,867 | B2* | 11/2005 | Hamaguchi | 365/185.03 |
| 7,158,434 | B2* | 1/2007 | Hokenmaier | 365/222 |
| 7,272,065 | B2* | 9/2007 | Lovett | 365/222 |

* cited by examiner

*Primary Examiner* — Pho M Luu (57) ABSTRACT

Systems design and methods are provided for maintaining the memory array stability while reducing power consumption in the form of leakage current in a memory array. One embodiment discloses a memory array system, which comprises a plurality of memory cells, a monitor cell array, a controller, and voltage regulator circuits. The controller receives information from the monitor cell array, determines the state of stability, and adjusts the voltage regulators accordingly to ensure the memory array stability and minimizes leakage.

17 Claims, 13 Drawing Sheets

LOW LEAKAGE HIGH STABILITY MEMORY ARRAY SYSTEM

CROSS-REFERENCE TO RELATED APPLICATIONS

This application claims the benefit of provisional patent application Ser. No. 60/821,135 filed 2006 Aug. 2 by present inventor.

This application has a application U.S. Ser. No. 11/825,717 filed Jul. 9, 2007 by present inventor. The application received the first Office Action on Mar. 18, 2009, and the reply to its Office Action was mailed on May 27, 2009, which requests amendments to the Specification, claims and a drawing.

The application U.S. Ser. No. 11/825,717 has been expressly abandoned by the filing of form PTO/SB/24 Express Abandonment under 37 CFR 1.138 for the application, and the form was mailed to The Commissioner for Patents on Jan. 25, 2010.

FEDERALLY SPONSOR RESEARCH

Not Applicable

SEQUENCE LISTING OF PROGRAM

Not Applicable

TECHNICAL FIELD

This invention relates to electronic circuits, more specifically, to a Static Random-Access Memory (SRAM) device and a circuit control method to provide low leakage and high stability of memory cell during all modes of operation.

BACKGROUND

Memory circuits used for data storage and computing operations are used in a large variety of consumer electronics, such as computers and cellular telephones. Memory cells in a memory circuit, such as a static random access memory (SRAM), are typically arranged in an array. This memory array includes individually addressable rows and columns to which data can be written and read. The memory array is considered to be in activation mode when data is transferred to and from the memory array. When the memory array is not accessed and there is no data transfer for a period of time, the memory array can be put in standby mode. A portion of peripheral circuitry will be in power down mode to save power and the array is ready to be accessed with minimum data delay penalty. The memory array can also be put in a sleep mode when the majority of peripheral circuitry is in power down mode or when power is cut off from the circuit. Power is only applied to essential circuits for maintaining the memory cell data.

During all modes of operation the memory array consumes power through memory cell leakages. The leakage power in a present high-performance microprocessor device can reach up to 40% of the total power consumption and the memory cell leakage is a major part of this leakage power. There is an increasing demand in consumer electronic markets for smaller circuit packages that consume less power for the purpose of conserving battery-life, such as wireless communication applications. To achieve reduced power consumption, multiple voltage supplies are used to apply a lower voltage level across the memory array, while using a higher voltage supply for the peripheral. The device performance is maintained while memory array leakage power is reduced. Furthermore, the memory array supply voltage can be further reduced to minimize leakage during standby or sleep mode.

Figure 1:
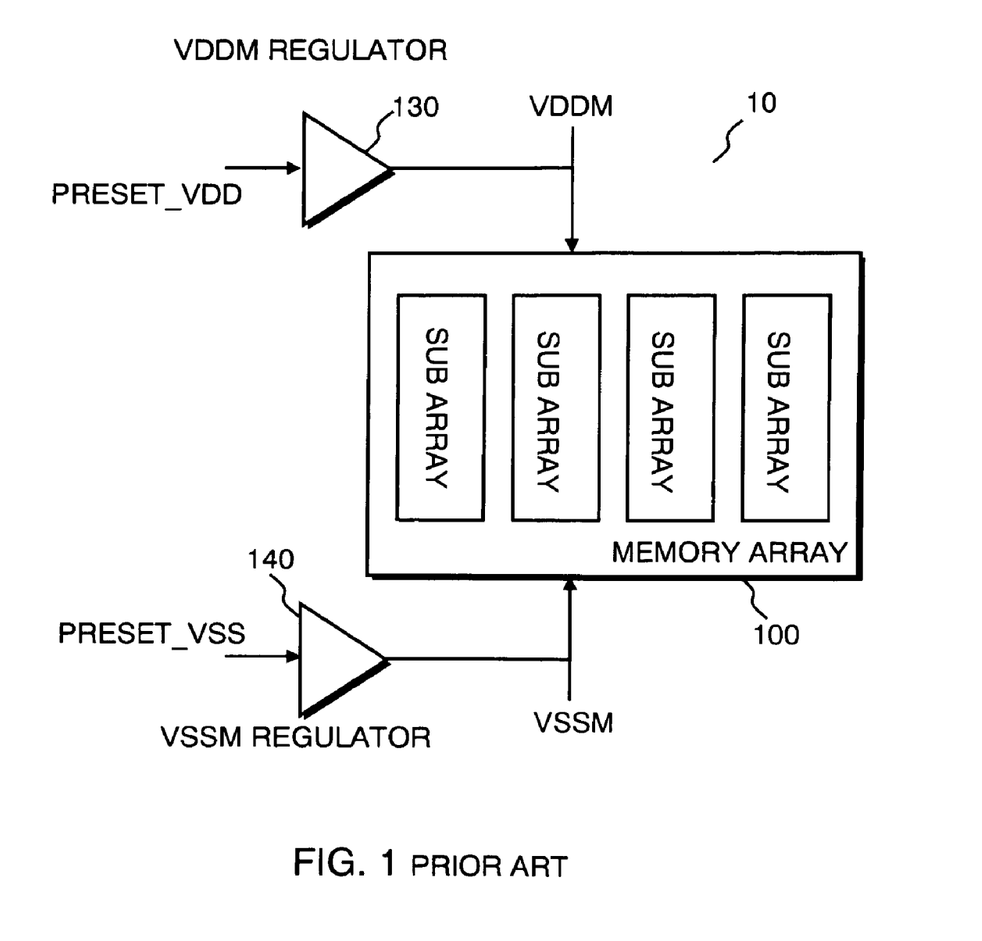
FIG. 1 illustrates a block diagram of a modern conventional design of a low leakage operation memory array.

The reduced memory array voltage technique for low leakage designs has a serious effect on the ability of data memory cell to retain data. The stability of the memory cells can be compromised, which means memory array data can be destroyed by read or write operations to the array during the active mode. The memory cells can also lose data during any other operations besides active mode, such as in the standby or sleep mode. FIG. 1 shows a conventional memory array architecture generally designated 10 used in modern SRAM designs for low leakage SRAMs. This design uses two preset voltage regulators 130 and 140 for providing voltage supplies to the memory array 100. Since the array voltage is preset, loss of data can be induced by incorrect voltage levels applied across the memory cells. Also they are not optimum for maintaining stability during internal or external disturbance events. The cause of a disturbance can come from any means such as, process variations, voltage fluctuations, temperature variations, or design flaws. What is needed in the art is design method that minimizes leakage power consumption and sustains memory stability during all modes of operation and disturbances, but dynamically maintains an optimum voltage supply across the memory cell array

SUMMARY

One embodiment of the present invention discloses a memory array system. The memory array system comprises a plurality of memory cells, a monitor cell array, a controller, and voltage regulator circuits. The controller receives information from the monitor cell array, determines the state of stability, and adjusts the voltage regulators accordingly that ensure memory array stability and minimizes leakage.

The present invention discloses five embodiments for the construction of monitor cells for generating information of stability to the controller. The monitor cell construction methods use asymmetrical circuit designs applied to the cell NMOS transistors and PMOS transistors to achieve a preferred state for each cell. The strength of preferred state for each cell is achieved by a varying degree of asymmetry in the transistors' sizing.

The present invention discloses four embodiments for the placement of monitor cells inside a memory array. The monitor cells are placed at the perimeter of the array taking advantage of the end point of the power run. Reducing the amount of monitor cells in the array minimizes the layout penalty. The monitor cell data access can be allowed by reusing the standard memory data bus to minimize the array layout area and facilitates monitoring operations.

The present invention discloses a construct and method of circuit operation for the design of the circuit that will control the stability of the memory array. The circuit contains a monitor cell array that generates output signals to a digital counter and the output drives a Digital to Analog Converter (DAC) and a voltage regulator. The circuit adjusts the power supply to keep the monitoring array at the edge of stability in a loop back fashion. This ensures the memory array is fully in the stability region and minimizing array leakage.

Another embodiment of the present invention discloses a circuit comprised of a monitor cell array and two digital counters. The output from the device drives two DACs and two voltage regulators for adjusting both high and low voltage supplies across the memory array for keeping memory array in the stability region while minimizing array leakage.

The present invention discloses a method and construction of a controller circuit and a monitor array. It has two monitor cells; one is used for controlling the stability during a memory active mode and the other is for a standby or sleep mode. The monitor cell used for active mode has a higher strength of preferred state for generating a higher voltage level across the array. This provides a higher stability margin for the memory array. The monitor cell used for standby or sleep mode has a lower strength of preferred state for generating a lower voltage level across the array. This provides a lower array leakage.

Another embodiment of the invention discloses a method and construction of a controller circuit using a preset counter to increase the voltage across the memory array at the transition from a standby or sleep mode to an active mode. The code from a preset counter is added to the voltage generator circuit to bring the array voltage to an acceptable level at the onset of an active mode. This allows immediate access to the memory array coming out of the standby or sleep mode.

DETAILED DESCRIPTION

Figure 2:
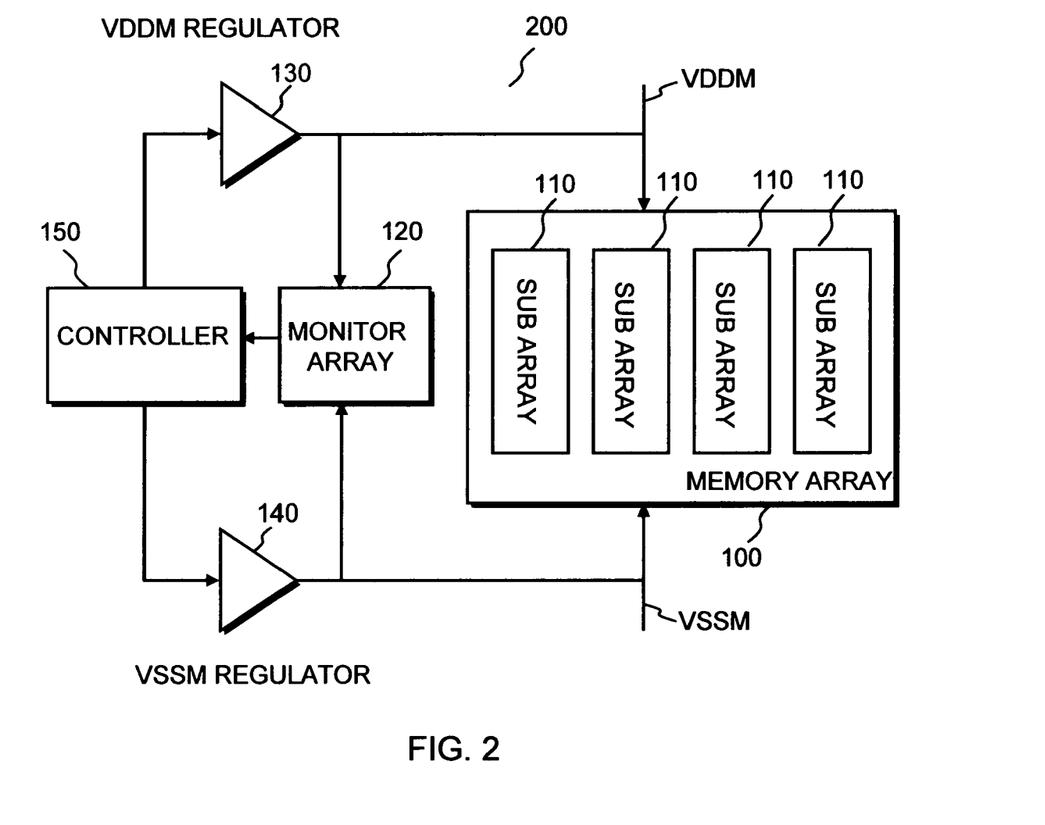
FIG. 2 illustrates a block diagram of a memory array design in accordance with an aspect of the invention.

The invention relates to electronic circuits, more specifically, to a Static Random-Access Memory (SRAM) device and a circuit control method to provide low leakage and high stability of memory cell in all modes of operation. Referring to FIG. 2, this illustrates a block of a SRAM design generally designated 200 and is constructed according to the principal of the present invention. The SRAM device includes a memory array 100, which has a plurality of sub memory arrays 110, a monitor array 120, VDDM voltage regulator 130, VSSM voltage regulator 140, and a controller circuit 150. The operation of these circuits is as follows: during a memory operation, regulators 130 and 140 supply power to the memory array through circuit nodes designated VDDM and VSSM respectively. Typical voltages of VDDM and VSSM are 0.8V and 0.3V respectively. The supply voltage across these two nodes of about 0.5V provides the necessary power for the array to maintain the data through memory operations. In a standard circuit practice, the voltages across nodes VDDM and VSSM are preset and constant during operations. In this invention, however, the voltage levels at these nodes are controlled and modified by the controller 150. This controller circuit receives information from the monitor array 120 and adjusts the voltage levels applied to the whole array accordingly to ensure the stability of the memory array. It is understood that other peripheral circuits such as read, write, sense amps, and row and column driver circuits are omitted in this illustration since they are standard circuits that would always be required for memory array operations.

Note, in this embodiment the controller is connected to two voltage regulators 130 and 140, however, it is understood that the controller can be set up for controlling any other supplies, or any other control signals connected to the array that have an effect on the stability of the array.

Figure 2A:
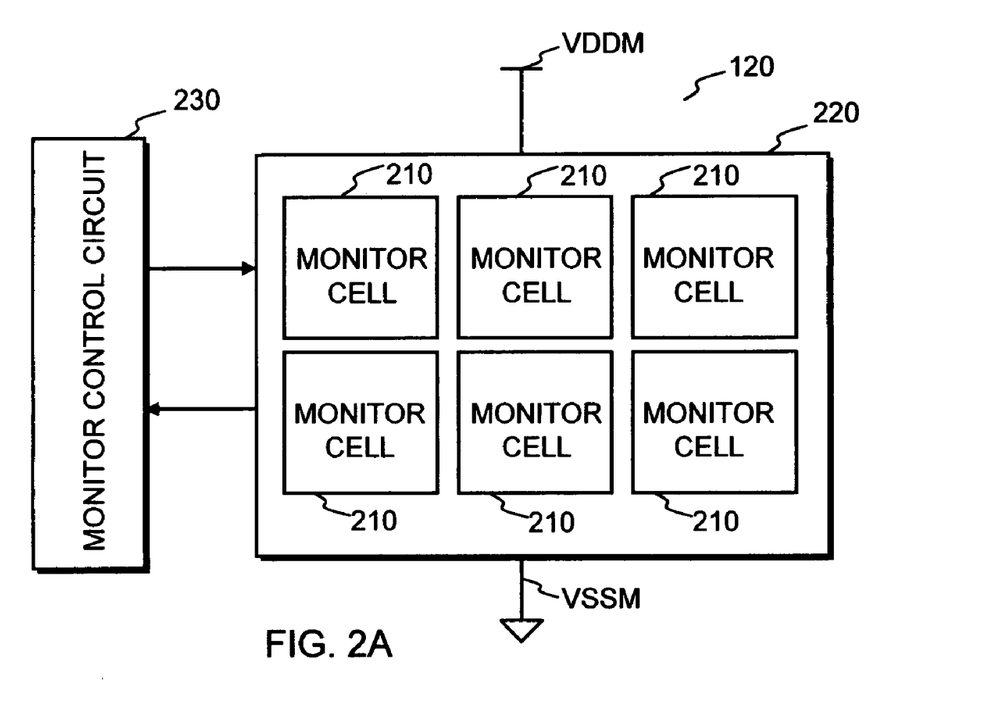
FIG. 2A illustrates a block diagram of a monitor cell array design in accordance with an aspect of the invention.
Figure 3:
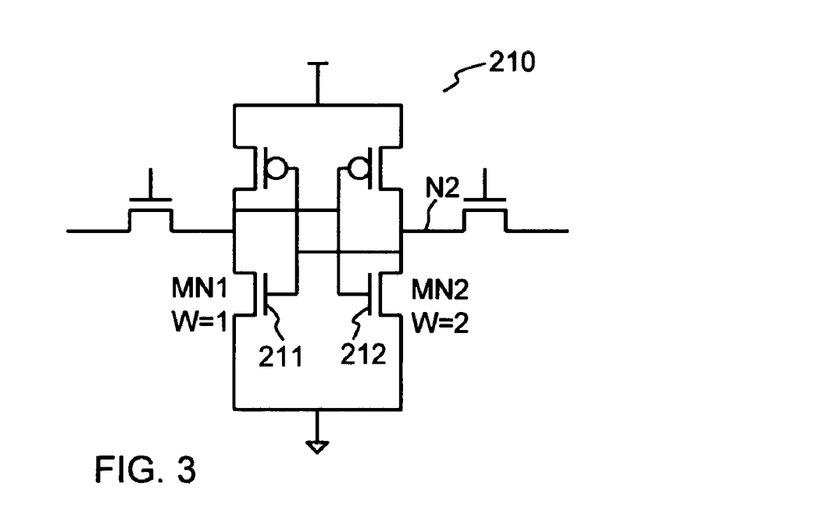
FIG. 3 shows a construction of a monitor cell in accordance with an aspect of the invention.

FIG. 2A shows the block diagram of an embodiment the monitor array 120. The monitor array includes a monitor control circuit 230, and a memory array 220 which houses a plurality of monitor cells 210. Monitor cell 210 is essentially a memory cell, but has been modified to serve as a monitoring cell. It is constructed such that it has a preferred state, which the cell will have a tendency to switch to. This is opposite to a standard memory cell, which gives equal chances for switching to either "1' or "0" data state. Note that it is desirable for a standard memory cell to have no preferred state An embodiment of the monitor cell 210 is shown in FIG. 3. In this cell the width (W) of NMOS transistor 212 (MN2) is larger than the width of transistor 211 (MN1). This asymmetry in sizing gives the cell a preferred state of having the N2 node at low potential, designated as a "0' state. It can be seen that in a disturbance condition in which the cell is allowed to choose a state, the monitor cell will likely switch to or remain at the "0" state.

Figure 3A:
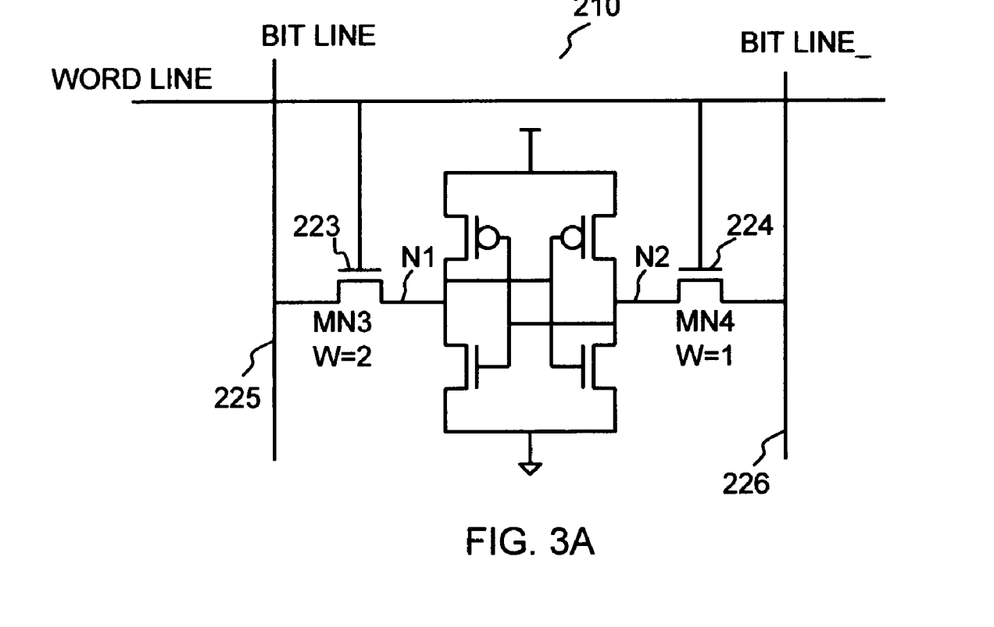
FIG. 3A illustrates another construction of a monitor cell in accordance with an aspect of the invention.

FIG. 3A shows another embodiment of monitor cell 210, in which the width of the NMOS transistor 223 (MN3) is larger than transistor 224 (MN4). During operations when both transistors are on and connected to bit lines nodes 225 and 226 at a higher voltage potential, the asymmetry in sizing will give the cell a preferred state of having the N1 node at high potential or "0" state.

Figure 3B:
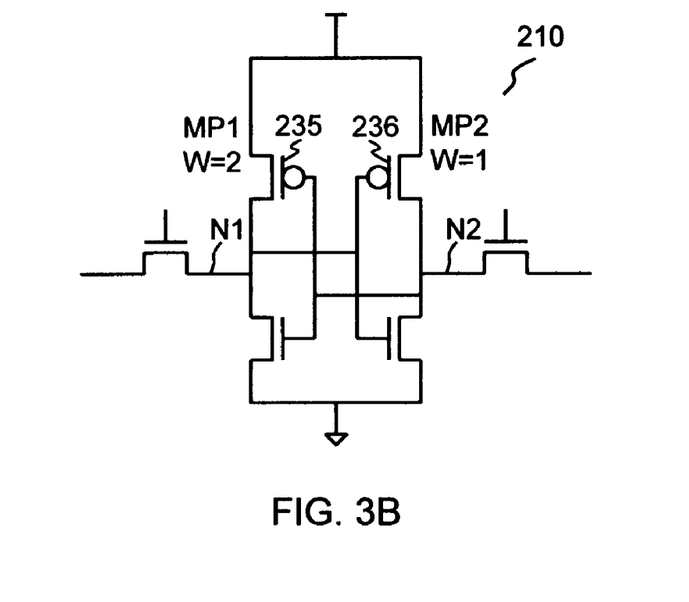
FIG. 3B illustrates yet another construction of a monitor cell in accordance with an aspect of the invention.

FIG. 3B shows another embodiment of monitor cell 210, which the width of PMOS transistor 235 (MP1) is larger than transistor 236 (MP2). This asymmetry in sizing also gives the cell a preferred state of having the N1 node at high potential or "0" state.

Figure 3C:
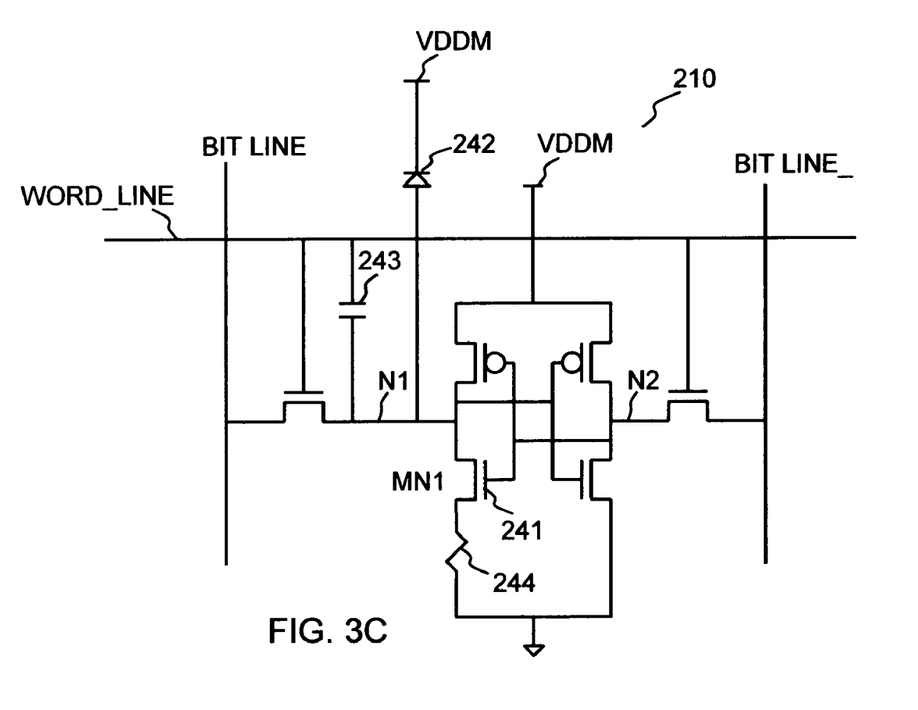
FIG. 3C illustrates yet another construction of a monitor cell in accordance with an aspect of the invention.

FIG. 3C shows other techniques that can be used to put a monitor cell 210 into a preferred state. A diode 242 connecting node N1 to VDDM will cause an additional leakage path to VDDM, giving the cell a preferred state of having the N1 node at high potential or "0" state. A capacitor 243 coupling from the WORD_LINE node to N1 will also give the cell a preferred state of having the N1 node at high potential or "0" state during the memory access in which WORD_LINE node is activated. A resistor 244 placed at the source of transistor 241 (MN1), in effect, will weaken the transistor and give the cell a preferred state of having the N1 node at high potential, or "0" state.

Figure 3D:
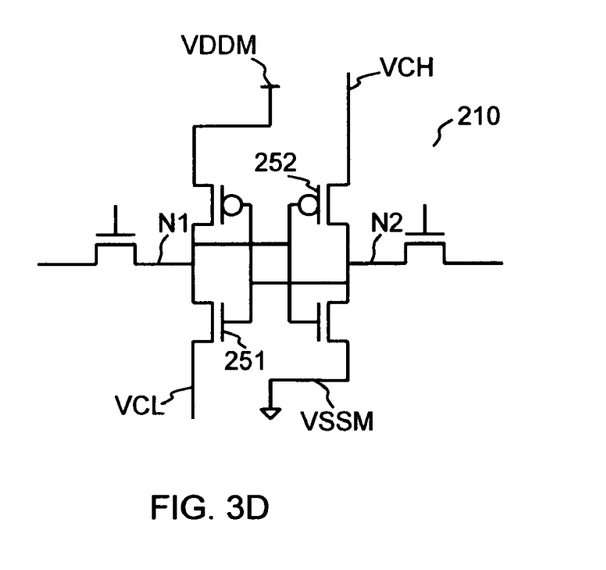
FIG. 3D illustrates yet another construction of a monitor cell in accordance with an aspect of the invention.

FIG. 3D shows another technique used to put a monitor cell 210 into having a preferred state. The sources of transistors 251 (MN1) and 252 (MP2) are connected to external nodes VCL and VCH respectively. The voltages at these nodes will provide an operation asymmetry condition to the cell and will give the cell a preferred state. It can be seen that a VCL voltage level higher than VSSM will reduce the drive strength of transistor 251 and put the cell into a preferred state of having node N1 at high potential or "0" state. A VCH at a lower potential than VDDM will weaken transistor 252 and put the cell into a preferred state of having node N2 at low potential or "0" state. These techniques provide two advantages. One advantage is the ability to use a minimum modified standard memory cell for a monitor cell without excessive transistor modifications as in FIG. 3, 3A, 3B and 3C. Since the layout of memory cells is critical for the construct of the array, it is desirable that the cell modifications be kept to a minimum so that monitor cells can be placed inside the standard memory array if needed. The other advantage is the monitor cell's preferred states are electrically controllable. Note that the cell can have either one or both transistors connected to the external supplies to benefit from the techniques. Note that any of transistors inside the cell can be electrically connected as described to achieve the desired functionalities and advantages. In addition, it is to be understood that any one or combination of circuit methods described in FIG. 3, FIG. 3A, FIG. 3B, FIG. 3C and FIG. 3D can be used to give the cell a preferred state.

The strength of preferred state is defined as how strong the tendency of a monitor cell to switch back to it preferred state. It can be seen that in the case of monitor cell embodiment 210 shown in FIG. 3, the larger width of transistor 212 (MN2) would increase the cell tendency to switch back to state '0'. Its strength of preferred state is higher than cells with a smaller MN2 transistor width. In a group of monitor cells, each cell can have its own strength of preferred state, ranging in a progressive fashion or in any other methods. The state of each cell in the group can be used to evaluate and determine the overall electrical condition of each group with a fine gradient.

The stability of a memory cell is defined as the resistance to change state. The monitor cell constructed as described in FIG. 3, FIG. 3A, FIG. 3B, FIG. 3C and FIG. 3D, has two distinguishable stability conditions depending on the data state it is in. When the cell is in its preferred state it would like to remain in this state, causing a higher stability than the cell in a non-preferred state. When the cell is in a non-preferred state it has tendency to switch to the preferred state, causing a lower stability than the cell in a preferred state. Since a standard memory cell is constructed to have no preferred state, it can be seen that the memory cell stability is in between the range of two described stability conditions of a monitor cell. In other words, the stability of a standard memory cell is lower than a monitor cell in its preferred state, but is higher than a monitor cell in its non-preferred state.

A memory disturbance event is defined as any physical or electrical event that can disturb the stability of the memory array and might cause a memory cell to lose its data. The disturbance event can be a single event such as a memory access cycle in active mode. It can be a variation in temperature, or when the voltage across the memory array drops to a lower level. In any case, it is desirable that at the worst event, the monitor cells that have a lower stability would switch to their preferred states before any memory cell loses its stability. This provides a warning signal to the system of the danger of loosing memory data.

Figure 4:
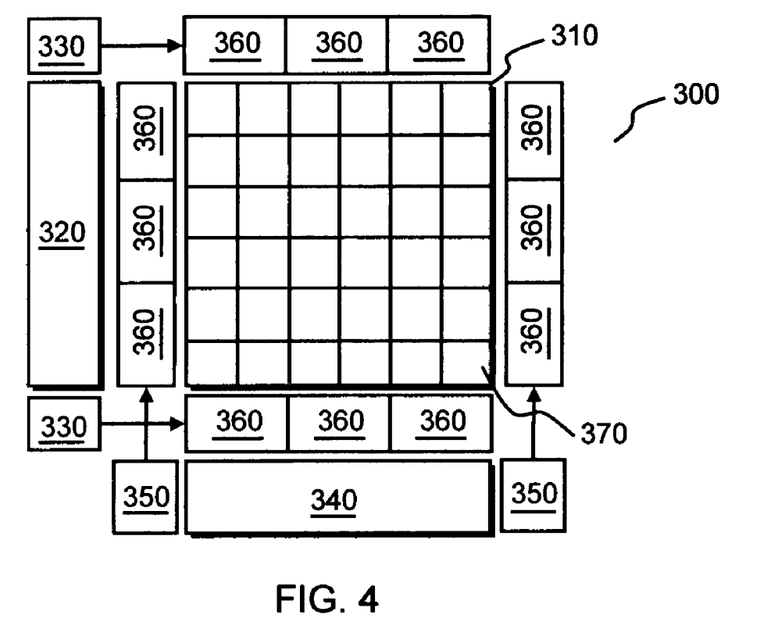
FIG. 4 illustrates the placement of monitor cells in a memory cell array in accordance with an aspect of the invention.

FIG. 4 shows the embodiment of the placement of monitor cells in a memory cell array design generally designated 300. The design includes a memory cell array 310 contains multiple of standard memory cells 370, a standard row circuit 320, two monitor row circuits 330, a standard column circuit 340, two monitor column circuits 350, and a plurality of monitor cells 360. Since the monitor and the memory array share the same power supply lines, it is desirable that the monitor cells be placed as close as possible to the memory cells that are subjects of the monitoring. It is also desirable that the monitor cells be placed so that it will receive the worst case disturbance or event. One such place is at the end of the power supply wire run, which might have the worst voltage drop in the array. Another is at the beginning of the row driver circuit, which might have the worst coupling from word-line to the cell during a memory access operation. The electrical connections to the monitor cells also should be as close to the real memory cells as possible, so that the condition of the array is truly monitoring.

In this embodiment, monitor cells are placed at the perimeter of the memory array. To accommodate the additional circuit modification in the monitor cell without disturbing the layout pitch of the array, monitor cells at the top and bottom of the array can have their layout width in a multiple of the width of a standard memory cell 370. In this embodiment the monitor cell layout width is twice the standard memory cell width. The monitor cells placed at the right and left side of the array can have the height in a multiple of a standard memory cell heights. As can be seen in this embodiment the monitor cell layout height is twice the standard cell height. Additionally, the peripheral circuits are required for accessing data in monitor cells. However, the cells along the left and right side can use the same row decoder of the standard cells and the cell along the top and bottom of the array can use the exiting bit-line circuit for data transfer operations. This design technique minimizes the overall array area layout impact of the array. For a memory array of 256 cells by 256 cells, the above embodiment has a total of 512 monitor cells around the array perimeter and an increase of cell array area by 1.6%. Since the monitor cells are placed around the array, one of the monitor cells is likely will be at the end of the supply's wire run. The worst-case supply voltage drops condition for monitor cells in the array is therefore achieved.

Two monitor row circuits 330 are used to drive the word-lines of monitor cells, one at the top and one at the bottom of the array. Two monitor column circuits 350 are used to serve the transfer data of the monitor cell, one at the left and one at the right of the array. Note, this embodiment of the monitor row and column circuitry allows them to be designed so that they can be activated independently, or in conjunction with the operation of the decoding circuit of the standard memory array circuit. This circuit design method allows the access of the monitor cell data either to be completely independent or in combination with the standard memory array access operations. The design also allows the controller to access the monitor cell data without a designated external data bus. The operation is as follows: during a standard memory access, the standard row decoder 320, in addition to the activation of memory cells along the word-line, also activates two monitor cells at the left and right of the array. Data from these two cells are read through the column circuits 350. If this is a monitor cell access event, monitor data is muxed into memory cell data lines to be placed onto the main data bus. Otherwise, data from memory cells are placed onto the main data bus. Monitor row circuit 330 allows access of monitor cell data along the top and bottom of the array using the standard memory bit lines. Monitor data accessing in this case is the same as a memory access cycle.

Figure 4A:
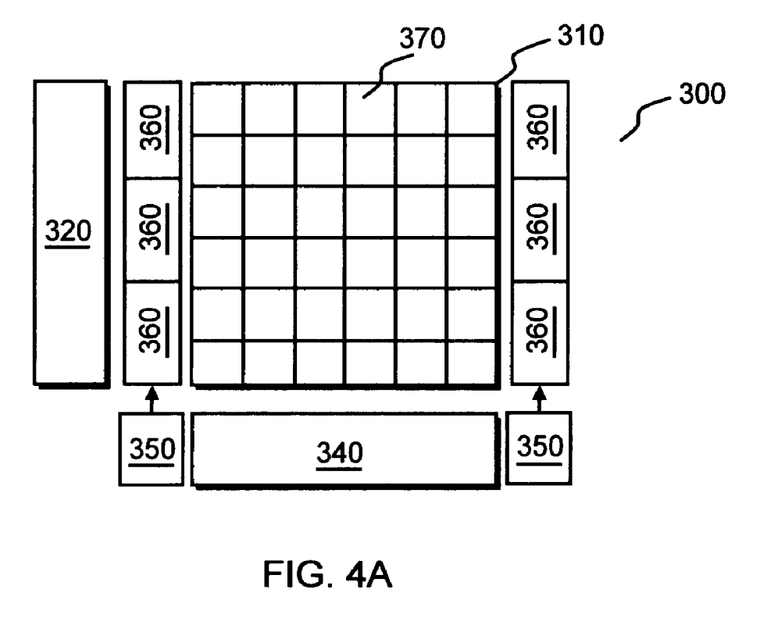
FIG. 4A illustrates the placement of a reduced number of monitor cells in a memory cell array in accordance with an aspect of the invention.
Figure 4B:
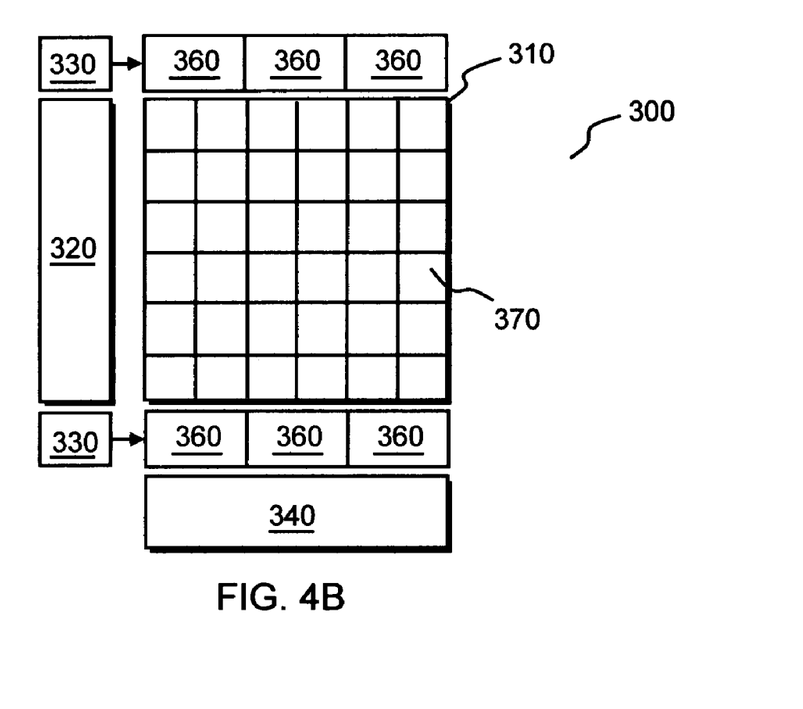
FIG. 4B illustrates the placement of another reduced number of monitor cells in a memory cell array in accordance with an aspect of the invention.

For some designs 1.6% increase of array area is unacceptable. The arrangement of the monitor cell can be modified according to FIG. 4A for a smaller silicon area. The monitor cells 360 in this embodiment are arranged only along the left and right side of the array, thus reducing the area impact to the array by half the previous arrangement. FIG. 4B shows another embodiment that has the monitor cells arranged only along the top and bottom of the array thus reducing the layout area impact to the array by about half of the arrangement in FIG. 4.

Figure 4C:
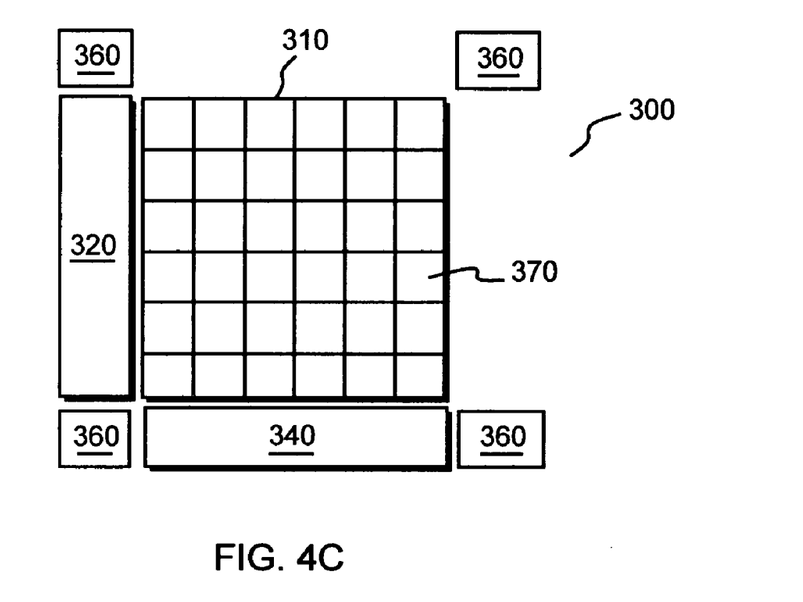
FIG. 4C illustrates the placement of yet another reduced number of monitor cells in a memory cell array in accordance with an aspect of the invention.

In FIG. 4C the number of monitor cells has been drastically reduced to merely four cells placed at the four corners of the array. Since there is fewer monitor data for a large array area, a slight reduction in accuracy of the monitoring function has been traded off for a much smaller silicon area.

If a close coupling of a monitor cell array to a memory cell array is not a priority, a central monitor cell array can be used for controlling multiple memory cell arrays connecting to a common memory power bus. In this case the accuracy of the control of the stability is traded off for a smaller layout area.

Figure 5:
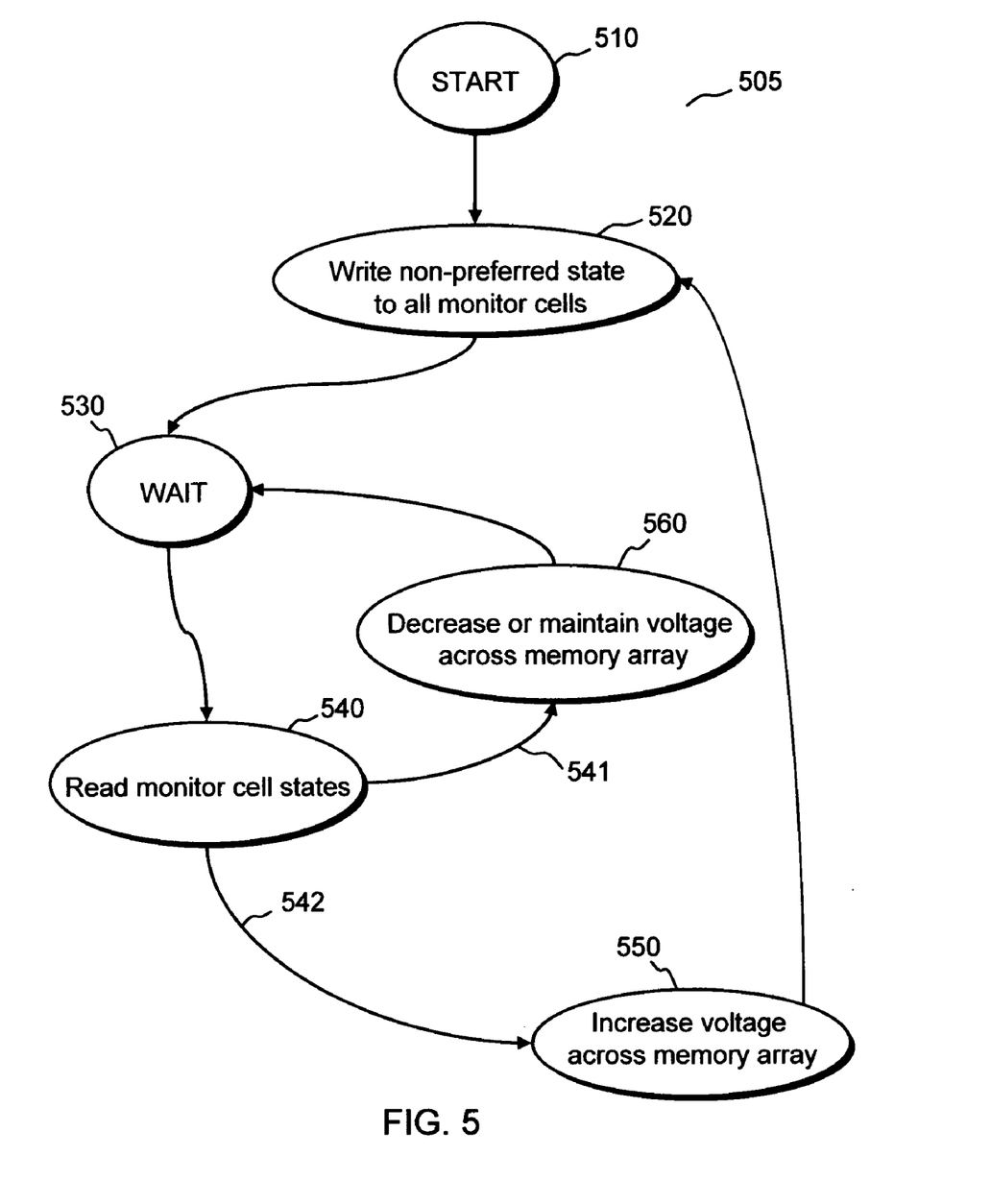
FIG. 5 illustrates the state diagram of the monitoring controller circuit operation in accordance with an aspect of the invention.

FIG. 5 shows a state diagram generally designated 505 for an embodiment of the monitoring function of the controller circuit 150 in FIG. 2. The operation is as follows: from a start state 510 the controller proceeds to state 520 and write all monitor cells to the opposite of their preferred states. The controller then enters a wait state 530. Periodically the controller ends the wait and enters the state 540 and read the monitor cell array. From this state there are two courses of actions. One is when the monitor cell data are intact the controller follows the 541 path and enters state 560. In this state it would either maintain the memory array status quo, or reducing the voltage across memory array to improve the power consumption, according to a preset requirement. Second is when the monitor cell data has been disturbed indicating the memory array had received disturbances that might cause potential array instability; the controller follows the 542 path and enters state 550. In this state it would attempt to remedy the condition which has caused the monitor cells to switch to their preferred states, in this case the action course is increase the voltage across memory array. The controller then returns to the state 520 and restart the monitoring cycle.

During memory array disturbance events, one or multiple monitor cells might switch to their preferred state. Periodically reading the data from the monitor cells would indicate the prior electrical condition of the memory array. Since the causes for the instability affect the monitor cells first, the condition is corrected before the instability of the array is compromised; therefore, array data is safe. Whether the cause of instability is from memory access cycles, voltage fluctuations, temperature variations, process deviations or defects, the controller 150 after reading the monitor cell data would have the information to react and can make an attempt to remedy the condition of memory array and improve the stability. In this embodiment the correction action for improving the stability is an increase of voltage supply across the memory array. The controller will rewrite the monitor cell data to the non-preferred state and start the monitoring cycle again. The next disturbance will indicate to the controller, through the stability of the monitor cells, that the previous attempt to correct the problem has been successful or not. If the voltage supply across the memory array were more than enough for the stability, the controller would see no change in the monitor cell data. In this situation it will make an attempt to improve the array leakage by decreasing the voltage across the memory array by a small amount. The controller will be constantly reading and re-writing the monitor cells, correcting the array condition to bring the array out of instability, and improve the leakage when the stability is established.

Figure 6:
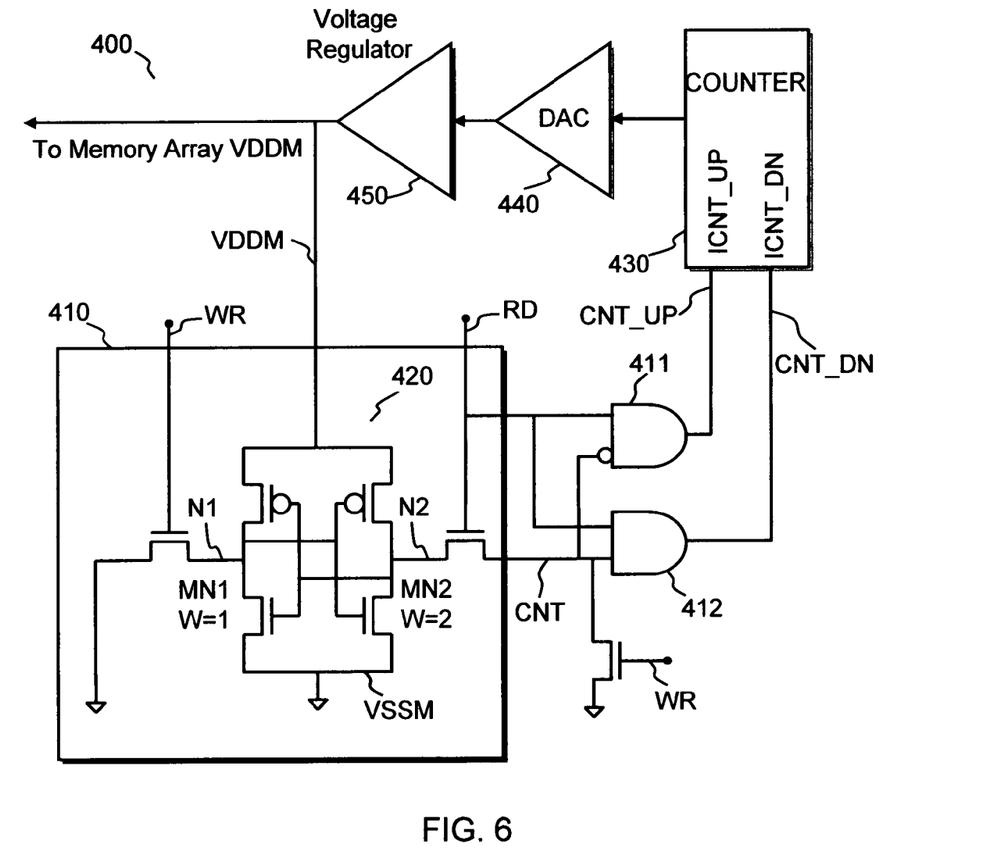
FIG. 6 illustrates the construction of a monitoring controller circuit in accordance with an aspect of the invention.

FIG. 6 illustrated an embodiment of a simple monitor cell and control circuit generally designated 400. This circuit can be placed inside or near the memory array to detect the instability of the target memory array. The array main power lines are connected to the VDDM node, and also to the monitor block designated 410, which contains at least one monitor cell. Note that only one monitor cell is illustrated in side this block and is designated 420. This circuit block is constructed as close as possible to a replica of the memory array, but in a smaller version. The monitor cell is essentially the same as one of embodiments of monitor cells illustrated in FIG. 3, FIG. 3A, FIG. 3B, FIG. 3C and FIG. 3D. It is to be understood that other signals connected to the memory array should also be connected to the counterparts in this monitor block, so that the electrical condition of the monitor block is essentially a replica of the memory array condition. The embodiment also includes a digital counter 430, a Digital to Analog Converter (DAC) 440, a voltage regulator 450 and supporting circuits 411 and 412. Note for this embodiment the digital counter 430 serves as a simple computing element for the monitor array data.

Figure 6A:
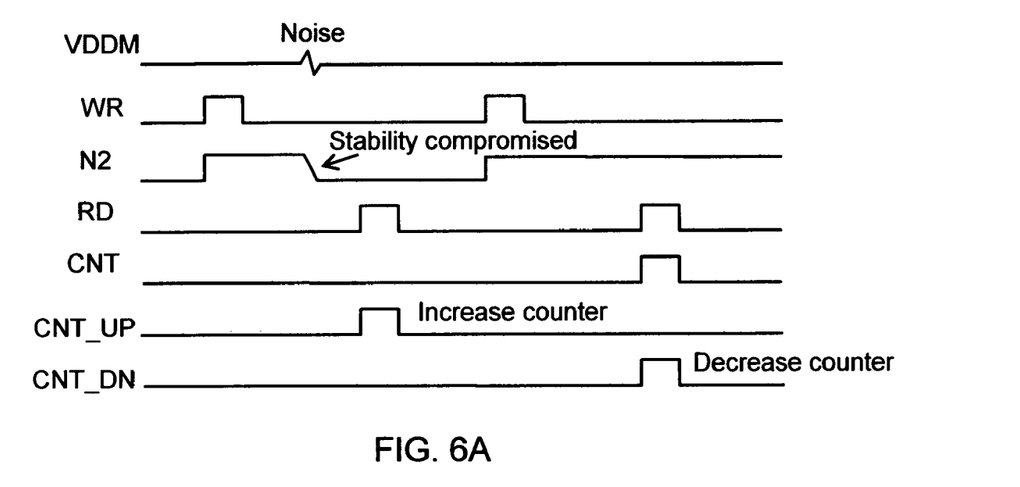
FIG. 6A illustrates the timing diagram of the operation of circuit in FIG. 6

To illustrate the operation of this circuit a timing diagram of circuit nodes in this block is shown in FIG. 6A. The operation of the circuit is as follows: at the beginning of the operation a WR signal pulsing from low to high will write "1" into a monitor cell 420, puts this cell into a non-preferred state and set node N1 equal to VSSM and N2 to VDDM. After a preset delay the signal RD pulses high and transfers the monitor cell data onto the signal node CNT. If the monitor cell has switched back to the preferred state due to a disturbance event, shown as noise on VDDM node in FIG. 6A, that has compromised the monitor cell data CNT node will remain low. Logic gates 411 and 412 generate CNT_UP and CNT_DN signals according to node CNT voltage. Each time the monitor cell switches back to its preferred state, a pulse appears at the CNT_UP signal as shown in FIG. 6A and counter 430 increases its count at each pulse. The counter output connected to DAC 440 and in turn driving voltage regulator buffer 450 to a higher voltage level for VDDM. The counter continues adjusting the VDDM voltage level until the monitor cell ceases switching back to its preferred state. Since the monitor cell shares the same electrical connections with the memory cell array, improving monitor array stability by increasing the voltage applied to VDDM will also improve the memory array stability. This minimizes the effects of further disturbance events to the stabilities of both monitor and memory arrays.

After RD pulses high and if the monitor cell maintains its prior written data, CNT_UP signal is held low and no action regarding memory stability is required. Note, since stability of the memory cell in the array is higher than that of the monitor cell, a stable monitor cell corresponds to a stable memory array state. At this point since the stability of memory array is established, the memory array leakage becomes the priority. The CNT_DN signal becomes active forcing counter 430 to decrease its count, lowering VDDM and in turn reducing the array leakage.

Figure 6B:
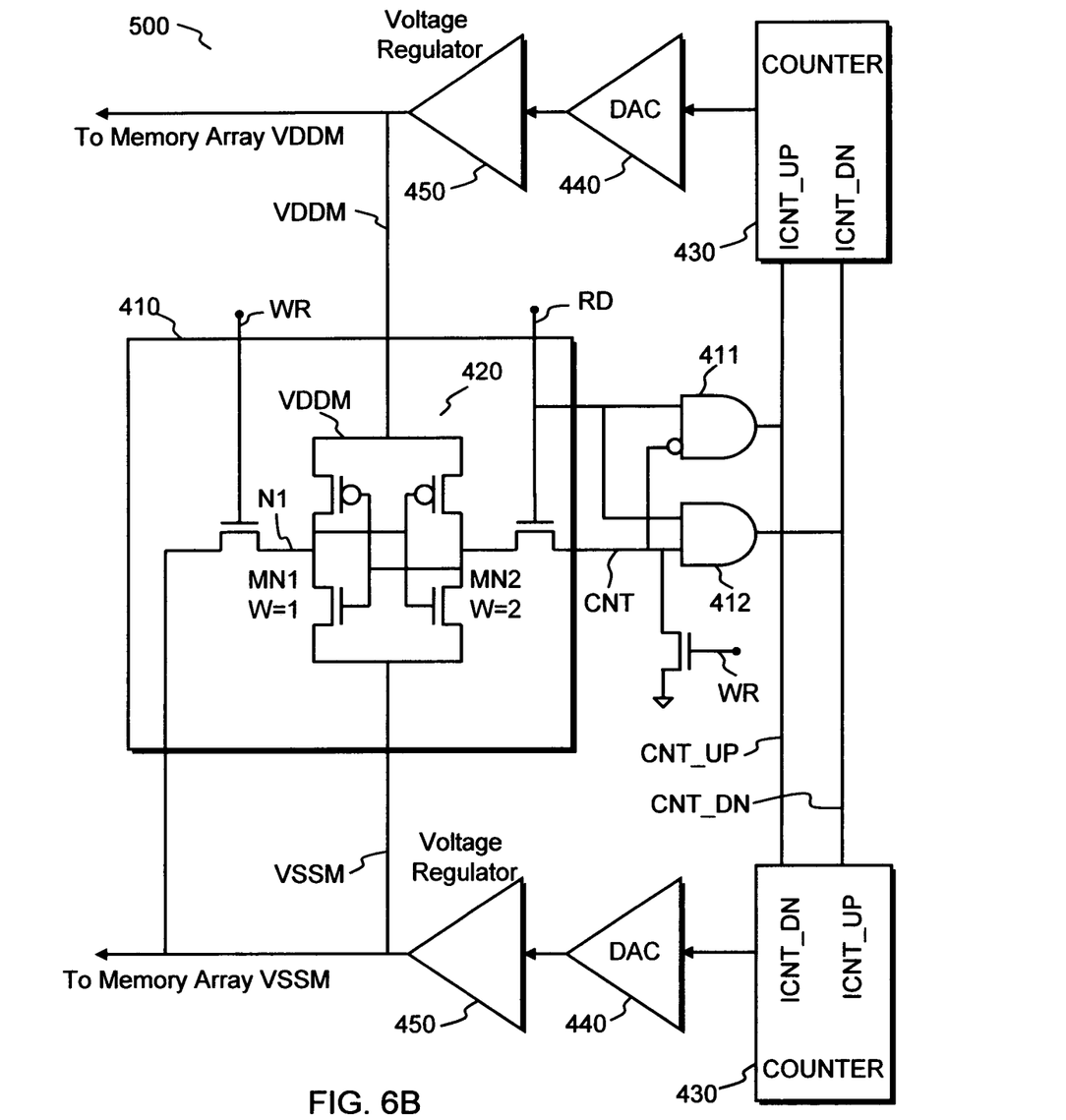
FIG. 6B illustrates the construction of another monitoring controller circuit in accordance with an aspect of the invention.

This circuit block can also be used to establish the minimum voltage across memory array at the beginning of system start-up period. During this period, the counter will be written with a minimum value and a minimum voltage level is applied across the memory array. Multiple monitoring cycles dispatching to this block will increase the VDDM from a minimum voltage to where the monitor cell ceases to switch back to it preferred state. At this time the array is receiving an optimum voltage that would provide lowest leakage power with an adequate stability margin. This technique would automatically bring the array to life without applying an over voltage across the array and avoiding overstress the array memory cell. In the course of a prolonged system operation, VDDM will be automatically decrease or increase to accommodate further degradations due to temperature, voltage variations, or other disturbances. Note, in this example a single monitor cell is placed inside the monitor block. However, a multiple of monitor cells can be used and the CNT signal can be generated by a logical combination of multiple cell states. FIG. 6B show another embodiment of monitor cell and control circuit generally designated 500 where a pair of counters 430, two DACs 440 and two voltage regulators 450 control both VDDM and VSSM nodes. The operation is similar to the circuit in FIG. 6. However, when VDDM voltage level increases, VSSM voltage decreases, and vise versa. The voltage across the array increases or decreases twice the amount of circuit in FIG. 6.

The voltage level that would cause memory cell array to become unstable under disturbances is defined as the memory array stability voltage. The voltage level that would cause monitor cells to become unstable under disturbances is defined as the monitor cell stability voltage. The array stability margin is defined as the voltage difference between the voltage applied across the array and the memory array stability voltage. Since monitor cells have a lower stability than memory cells, a higher voltage level across the monitor cell array is required to be able to maintain the monitor cells' stability. The array stability margin is therefore the difference of voltage level between the monitor cell stability voltage and the memory array stability voltage. Note that the monitor cell stability voltage is dependant on the strength of preferred state. Therefore modifying the monitor cell strength of preferred state will a have direct effect on the array stability margin. A higher strength requires a larger voltage across the monitor cell to keep it from switching to its preferred state thus increasing the array margin, and a weaker strength decreases the margin. This characteristic provides a useful method for controlling the array stability margin dynamically.

Disturbances from various sources often have different strength and affect the array differently. The read and write operations to the array from other circuitry cause the array instability each time the cells are accessed. The operations in active mode can inject noise into the cells asymmetrically and have an immediate and more detrimental effect on the memory cells. It can be seen that a greater memory array stability margin is needed during this mode. On the other hand, in the standby or sleep mode, since no memory access is accepted or expected, the memory array stability margin can be traded off for a lower array leakage by reducing the VDDM to a lower level. However, waking up from a sleep to an active mode and accepting memory access operations immediately would cause memory instability since the VDDM is not at a level that can counter the effect of the active mode operations. It is desirable to have a circuit method that minimizes this problem and maintains a low leakage array.

Figure 7:
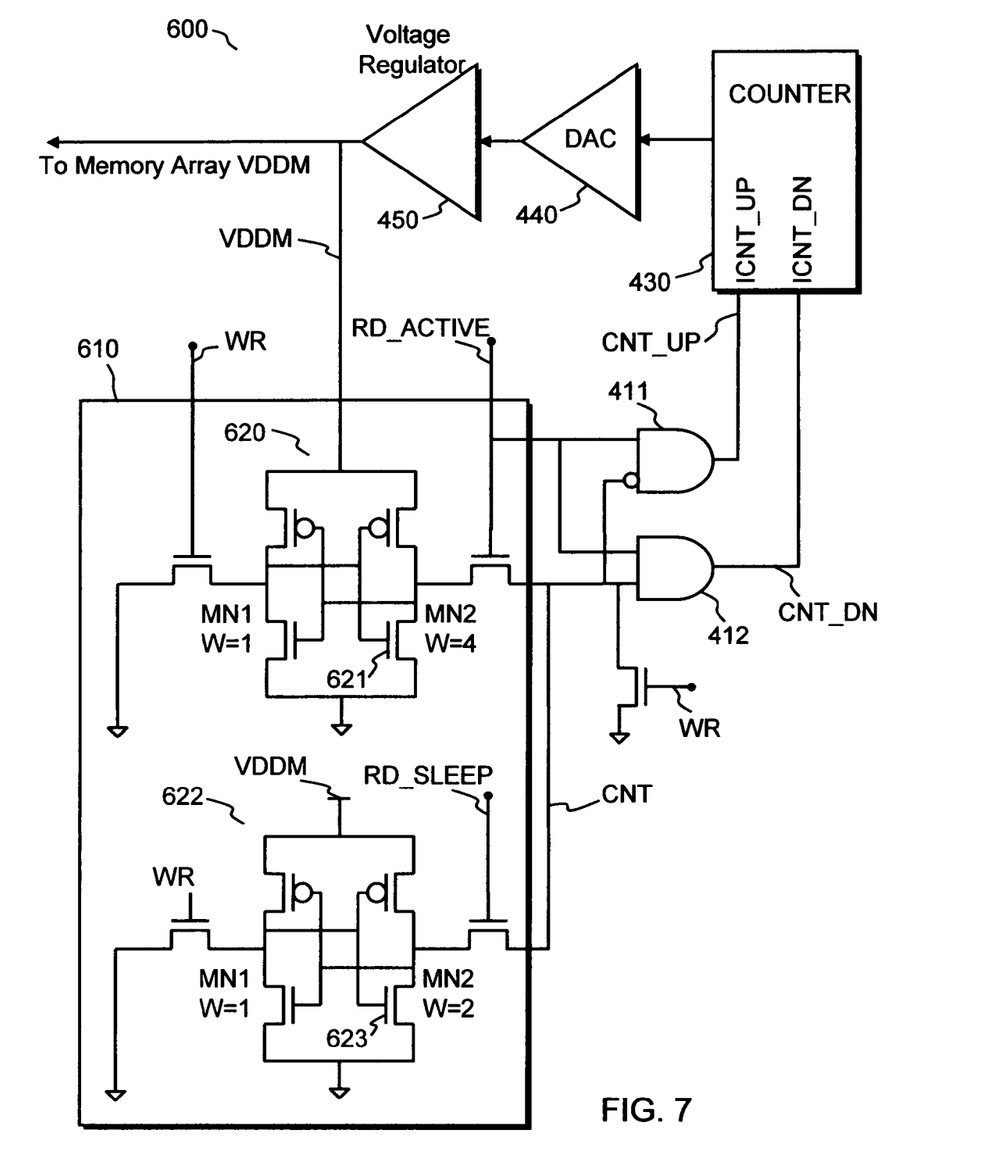
FIG. 7 illustrates the construction of a monitoring controller circuit for use in both active and sleep modes in accordance with an aspect of the invention.

FIG. 7 illustrates another embodiment of a monitor block and control circuit generally designated 600 for solving the instability of switching from an inactive such as sleep mode to an active mode. This circuit is similar to the circuit shown in FIG. 6, however, two monitor cells designated 620 and 622 are placed inside the monitor block 610. The monitor cell 620 is constructed such that it has a higher strength of preferred state than that of monitor cell 622. In this embodiment the width of transistor 621 is twice the width of transistor 623, and provides the monitor cell 620 with a preferred state strength higher than that of monitor cell 622. Disturbances equally applied to the two cells are more likely to cause cell 620 to switch to its preferred state than cell 622. During a monitoring cycle, signal RD_ACTIVE is activated only in active mode and RD_SLEEP will be used in sleep mode. Node CNT receives data from cell 620 when memory array is in active mode and from cell 622 in sleep mode. Since cell 620 requires a higher VDDM for stability, the memory array gets a higher stability margin during active mode. During sleep mode, a lower VDDM will be sufficient to maintain the stability of cell 622; therefore the array is operated at a lower VDDM and has lower leakage. Note, in both modes the array stability margin is always maintained. Only two monitor cells are presented in this embodiment. However, a combination of many cells having multiple strength of preferred state can be used for performing different modes of operations and finer degrees of accuracy.

Figure 7A:
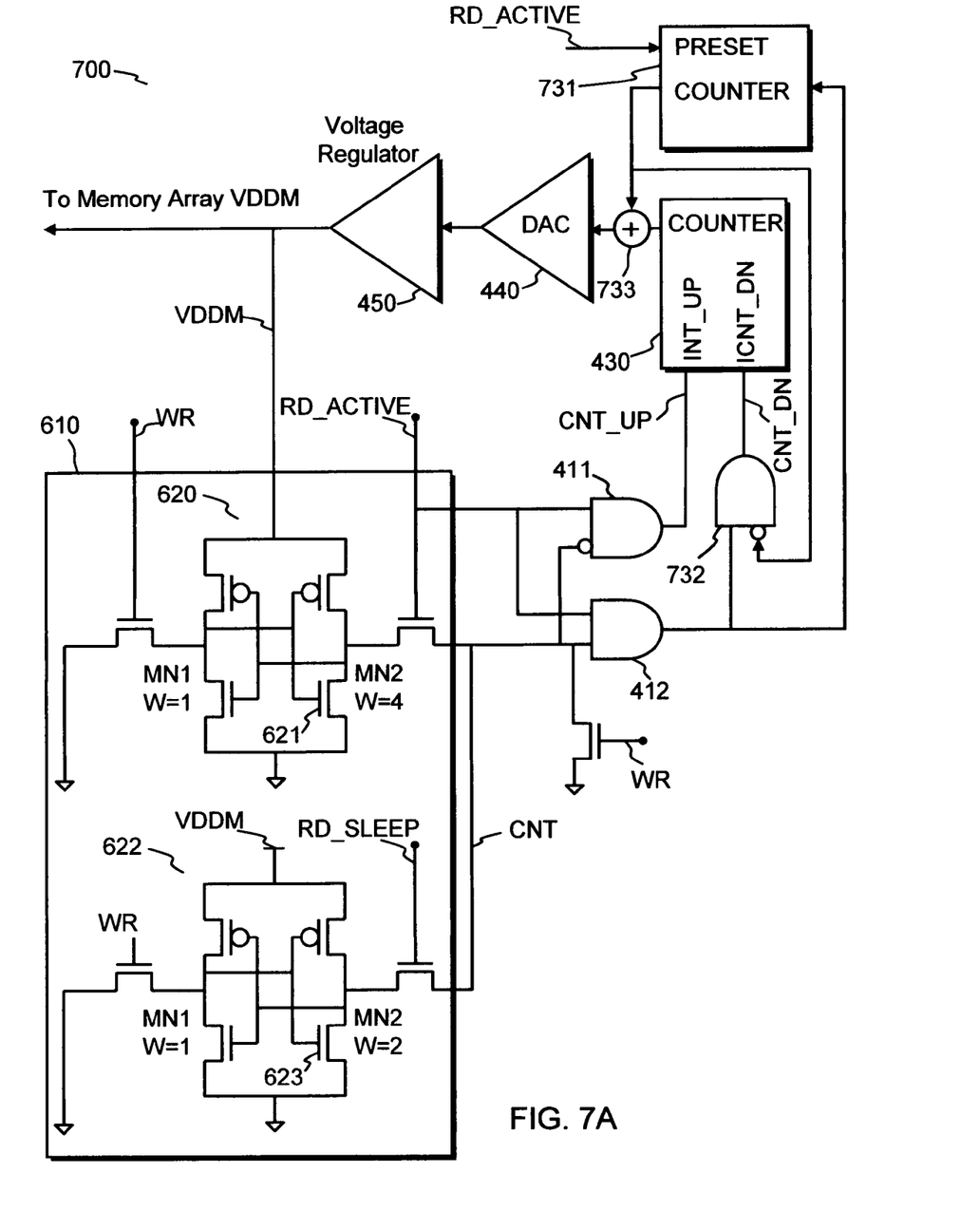
FIG. 7A illustrates the construction of another monitoring controller circuit for use in both active and sleep modes in accordance with an aspect of the invention.

It is desirable when a memory array waking up from a sleep mode to an active mode that the array is immediately ready to be accessed. However, if the stability margin is reduced during sleep mode, the array will need time to increase the VDDM to a level that will withstand the disturbances from memory accesses. Therefore, accessing the memory array immediately after waking up can cause memory instability. FIG. 7A shows another embodiment of a monitor block and control circuit generally designated 700 for controlling the array stability when transitioning from sleep to active mode. The circuit is similar to circuit in FIG. 7, but with an addition of a digital counter 731, a logic gate 732, and a digital adder 733. The operation of the circuit is as follows: during sleep mode counter 430 has the VDDM voltage level digital code for the sleep mode and the counter 731 is empty. When switching to active mode, RD_ACTIVE signal sets the counter 731 to a preset value, and this value is added by the adder 733 to the output code of counter 430. This in effect, increases VDDM voltage by the amount represented by the preset code in the counter 731. The array is now ready for memory accessing since additional voltage across the memory array has been added. Note the CNT_DN signal for decreasing the count of counter 430 is not available until counter 731 is empty, or has zero output. The counter 731 is only be able to count down and is the main counter for decreasing the VDDM voltage, and when counter 731 becomes empty the counter 430 will resume that function.

The above descriptions are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the invention.

What is claimed is:
1. A memory system architecture, comprising:
a) at least one memory array, which comprises a plurality of memory cells,
b) at least one monitor array, which comprises at least one monitor cell, c) said monitor cell comprises at least one mismatching pair of transistors and operable to store and output a data signal, d) first means for accessing data in said monitor array, and for generating at least one signal for controlling said monitor array and said memory array according to said data in said monitor array.

2. A memory system architecture recited in claim 1 wherein said memory array further comprises said monitor array coupling to said memory array electrical network.

3. A memory system architecture recited in claim 1 wherein said memory array further comprises a said monitor array integrated into said memory array.

4. A memory system architecture recited in claim 3 wherein said memory array further comprises:
 a) control signals,
 b) data buses, and
 c) decoders operable for accessing data independently from said memory array and said monitor array.

5. A memory system architecture recited in claim 3 wherein said memory array further comprises:
 a) at least one placement of said monitor array at corners of the said memory array,
 b) whereby providing a close coupling of said monitor array to said memory array and facilitating signal routings of said memory array.

6. A memory system architecture recited in claim 1 wherein said memory array further comprises:
 a) at least one placement of monitor array at where predetermine of maximum of voltage supplies drops occur,
 b) whereby maximizing effects of detecting said memory array disturbances for said monitor array.

7. A memory system architecture recited in claim 1 wherein said memory array further comprises:
 a) at least one placement of monitor array at where predetermine of maximum disturbances occur,
 b) whereby maximizing effects of detecting said memory array disturbances for said monitor array.

8. A memory system architecture recited in claim 1 wherein said first means comprises second means for executing a monitoring procedure, comprising steps of:
 a) write data to said monitor array,
 b) periodically read data from said monitor array,
 c) adjusting first means output voltages accordingly to data from said monitor array.

9. A memory system architecture recited in claim 1 wherein said first means further comprises third means for computing data of said monitor array.

10. A memory system architecture recited in claim 1 wherein said monitor array further comprises:
 a) a plurality of groups of said monitor cells,
 b) each said group of said monitor cells comprises at least one said monitor cell,
 c) said monitor cell comprises a predetermine degree of mismatching.

11. A memory system architecture recited in claim 10 wherein first means further comprises:
 forth means for adjusting said first means output signals according to data from each said group of monitor cells, and according to predetermine requirements for different operation modes of said memory array.

12. A memory system architecture, comprising:
 a) at least one memory array, which comprises plurality of memory cells,
 b) at least one monitor array, which comprises at least one monitor cell,
 c) said monitor cell comprises at least one predetermine electrical connection affecting stability of said monitor cell, which operable to store and output a data signal,
 d) fifth means for accessing data in said monitor array, and for generating at least one signal for controlling said monitor array and said memory array according to said data in said monitor array.

13. A memory system architecture recited in claim 12 wherein said monitor cell further comprises:
 at least one passive electrical component connected in a manner affecting stability of said monitor cell statically.

14. A memory system architecture recited in claim 12 wherein said monitor cell further comprises:
 at least one passive electrical component connected in a manner affecting stability of said monitor cell dynamically.

15. A method for improving stability and leakage of a memory system, comprising:
 a) providing at least one monitor cell, which comprises two states, preferred and non-preferred state, and operable to store and output a data signal,
 b) connecting said monitor cell and at least one memory array to a common electrical network
 c) setting said monitor cell into said non-preferred state,
 d) modifying said electrical network according to said monitor cell stability data and predetermine requirements,
 e) whereby adjusting said electrical network to maintain said monitor cell at a threshold of stability ensuring stability of said memory array, and minimizing over voltage supply conditions for improving said memory array leakages.

16. A method for improving stability and leakage of a memory system recited in claim 15 wherein said method further comprises:
 providing plurality of monitor cells, each of said monitor cells comprises a different preferred state strength.

17. A method for improving stability and leakage of a memory system recited in claim 15 wherein said method further comprises:
 modifying said electrical network according to operation modes of said memory array.

* * * * *